United States Patent
Schoellkopf

(10) Patent No.: US 7,321,153 B2
(45) Date of Patent: Jan. 22, 2008

(54) SEMICONDUCTOR MEMORY DEVICE AND CORRESPONDING PROGRAMMING METHOD

(75) Inventor: Jean-Pierre Schoellkopf, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 182 days.

(21) Appl. No.: 11/340,164

(22) Filed: Jan. 26, 2006

(65) Prior Publication Data

US 2006/0170063 A1   Aug. 3, 2006

(30) Foreign Application Priority Data

Feb. 2, 2005  (FR) .................................. 05 01007

(51) Int. Cl.
*H01L 27/10* (2006.01)
(52) U.S. Cl. ................ 257/390; 257/910; 257/E27.102
(58) Field of Classification Search ..................... None
See application file for complete search history.

(56) References Cited

U.S. PATENT DOCUMENTS

| 5,960,287 A | 9/1999 | Kunitou .................... 438/275 |
| 6,028,342 A | 2/2000 | Chang ....................... 257/390 |
| 6,344,679 B1 * | 2/2002 | Klaasen et al. ............ 257/594 |
| 6,674,661 B1 | 1/2004 | Becker ....................... 365/104 |
| 6,821,841 B1 | 11/2004 | Wu et al. .................... 438/243 |

* cited by examiner

*Primary Examiner*—Evan Pert
*Assistant Examiner*—Kevin Quinto
(74) *Attorney, Agent, or Firm*—Lisa K. Jorgenson; Allen, Dyer, Doppelt, Milbrath & Gilchrist, P.A.

(57) ABSTRACT

A semiconductor cell includes, within a substrate region, four active zones that are mutually laterally isolated, the first active zone to be connected to a first voltage, the second active zone, of an opposite type of conductivity to that of the first active zone, to be connected to a second voltage, the third and fourth active zones being mutually connected via an electrically conducting connection external to the substrate. The value of the binary data item is defined by an implantation of a chosen type in a predetermined part of the substrate region or in the third and fourth active zones.

22 Claims, 9 Drawing Sheets

SEMICONDUCTOR MEMORY DEVICE AND CORRESPONDING PROGRAMMING METHOD

FIELD OF THE INVENTION

The present invention relates to memories, more particularly to read-only memories (ROM memories), or more generally to an element for storing binary data that has a fixed value at the time of fabrication of an integrated circuit and can be read only subsequently, and in practice an integrated circuit that includes a set of such storage elements.

SUMMARY OF THE INVENTION

It is an object of the invention to provide a semiconductor memory device that is simple to produce, has a high density and offers a reduced, or even low, fabrication cost.

Another object of the invention is to provide a device that can be programmed in a flexible manner as required by the user.

Yet another object of the invention is to provide a memory device having a structure that makes it difficult to detect, from the outside (except of course when reading the memory or else carrying out an analysis of its internal structure), the contents of the binary data stored therein.

An embodiment of the invention is a memory device comprising at least one cell, and in practice a set of cells. Each cell stores a binary data item and comprises, within a semiconductor substrate region, for example a p-type substrate, four active zones that are mutually laterally isolated. The first active zone is intended to be connected to a first voltage and the second active zone, of an opposite type of conductivity to that of the first active zone, is intended to be connected to a second voltage.

As an indication, the first voltage is generally what is called a circuit supply voltage which may range up to 5 volts in a high-voltage technology and up to 1 volt in a submicron technology. As an indication, the second voltage is a reference voltage, generally ground. The third and fourth active zones are mutually connected via an electrically conducting connection external to the substrate, for example via two contacts and a metal wire.

The semiconductor cell also includes semiconductor "electrical connection" means internal to the substrate, designed so as to electrically connect at least one or other of the third and fourth active zones to the first active zone or else to the second active zone depending on the logic value of the binary data item. The semiconductor cell also includes semiconductor "electrical isolation" means, internal to the substrate, also called for example "buried layers", and designed to electrically isolate the third and fourth active zones from the second active zone or else from the first active zone, respectively.

The semiconductor electrical isolation means comprise, for example, pn junctions forming non-conducting (or reverse-biased) diodes: between at least one active zone and the substrate region; or between at least one active zone and a semiconductor well located in the substrate region, this semiconductor well having an opposite type of conductivity to that of the substrate region and having an interface with at least this active zone; and/or between the well and the substrate region. Moreover, the semiconductor electrical connection means therefore advantageously comprise the substrate region or the well.

Thus, according to this aspect of the invention, the programming of the logic value, 0 or 1, of a binary data item to be stored in the cell depends on the arrangement of the semiconductor structure of the cell, which will have as a consequence, when the first and second active zones are taken to the first and second voltages, of taking the connection between the third and fourth active zones either to the first voltage (for example the supply voltage) or to the second voltage (for example, ground) depending on this arrangement, that is to say depending on the logic value of the binary data item.

These various arrangements of the semiconductor structure of the cell are advantageously effected by implantation of chosen type in a predetermined part of the substrate region or in the third or fourth active zones, which consequently makes it difficult to detect, from the outside (without actually reading the memory or else actually analyzing the buried semiconductor structure of the cell), the programming of the memory cell.

According to a first variation of the invention, the third and fourth active zones have respectively two opposite types of conductivity ($n^+$ and $p^+$). The cell includes the well having interfaces with the third and fourth active zones and with that of the first or second active zones having the same type of conductivity as that of the well, or else does not include such a well. Whether or not the cell includes the well determines the logic value of the binary data item stored.

The first active zone, which is intended to be connected to the first voltage (for example, the supply voltage) is for example of n-type conductivity whereas the second active zone, which is intended to be connected to the second voltage (for example ground), is of p-type conductivity. The optional well then has an n-type conductivity.

In another variant of the invention, the third and fourth active zones both have the same type of conductivity (n or p). The semiconductor structure of such a cell then includes a well having an interface with the third active zone and with that of the first or second active zones having the same type of conductivity as that of the well. Furthermore, in this variant, it is the type of conductivity (n or p) of the third and fourth active zones that defines the logic value of the binary data item.

In practice, the device advantageously comprises a set of cells storing a set of binary data items. Thus, the device may be a matrix memory of cells. The device advantageously also includes means for reading each cell, these read means comprising a first voltage source connected to the first active zone, a second voltage source connected to the second active zone and measurement means, for measuring the voltage present at the connection for connecting the cell.

A method aspect of the invention is directed to reading the logic value of a binary data item contained in a cell of a memory device as defined above. According to this other aspect of the invention, the first voltage (for example, the supply voltage) is applied to the first active zone, the second voltage (for example, ground) is applied to the second active zone and the voltage at the connection is measured.

Yet another subject of the invention is a method of programming a binary data item in a cell comprising, within a semiconductor substrate region, four active zones that are mutually laterally isolated, the first active zone being intended to be connected to a first voltage, the second active zone, of an opposite type of conductivity to that of the first active zone, being intended to be connected to a second voltage, the third and fourth active zones being mutually connected via an electrically conducting connection external to the substrate. Thus, the value of the binary data item is defined by an implantation of chosen type in a predetermined part of the substrate region or in the third and fourth active zones.

Thus, according to a variant of the invention in which the third and fourth active zones have opposed types of conductivity, the logic value of the binary data is defined by implanting or not implanting, in the substrate region, a semiconductor well having an opposite type of conductivity to that of the substrate region, and having interfaces with the third and fourth active zones and with that of the first or second active zones having the same type of conductivity as that of the well.

In another variant of the invention, in which the third and fourth active zones both have the same type of conductivity and in which a semiconductor well having an opposite type of conductivity to that of the substrate region, and having an interface with the third active zone and with that of the first and second active zones having the same type of conductivity as that of the well, is implanted into the substrate region, the logic value of the binary data item is defined by choosing the type of implantation (n or p) for the third and fourth active zones. When it is desired to program the values of a set of binary data items respectively contained in a set of semiconductor cells, each cell is then advantageously programmed by a method as defined above.

In one method of implementation, compatible with the variant of the invention in which the logic value of the binary data item is chosen by implanting, or not, a well in the substrate region, the locations of implantation of the optional wells of all the cells of the memory via apertures in an implantation mask, for example made of a resist, are defined and all the wells are simultaneously implanted through the apertures in the mask.

According to another method of implementing the invention, compatible with the variant of the invention in which the logic value "0" or "1" of the binary data item is programmed by choosing the type (n or p) of conductivity of the third and fourth active zones, an implantation mask of $n^+$ type and an implantation mask of $p^+$ type are defined and all the active zones of all the cells are simultaneously implanted through the apertures in the implantation masks using the two implantation masks in succession.

The locations of the apertures in the implementation mask or masks may be defined by a photolithography mask and/or by an electron beam. In other words, the locations of the apertures in the resist mask are defined using a photolithography mask. In this case, the resist is irradiated through the photolithography mask. This option makes it difficult for the programming to be carried out in a flexible manner since a modification in the programming from one batch of memory devices to another would require the production of a new lithography mask.

However, another possibility includes irradiating the resist through the well-known electron beam (or E-beam) technique. It is then possible to decide, on a case by case basis, taking into account the desired programming for the memory device, and the location of the apertures in the resist mask. Such an option therefore offers maximum flexibility.

A third option includes combining photolithography with an electron beam. In other words, for example the programming of part of the integrated circuit other than the memory, together with part of the memory, would be "frozen in" by using a photolithography mask, while the other part of the memory could be programmed flexibly by using the technique of electron beam irradiation.

BRIEF DESCRIPTION OF THE DRAWINGS

Other features and advantages of the invention will become apparent from examining the detailed description of entirely non-limiting embodiments and methods of implementation, and the appended drawings in which.

DETAILED DESCRIPTION OF THE PREFERRED EMBODIMENTS

Figure 1:
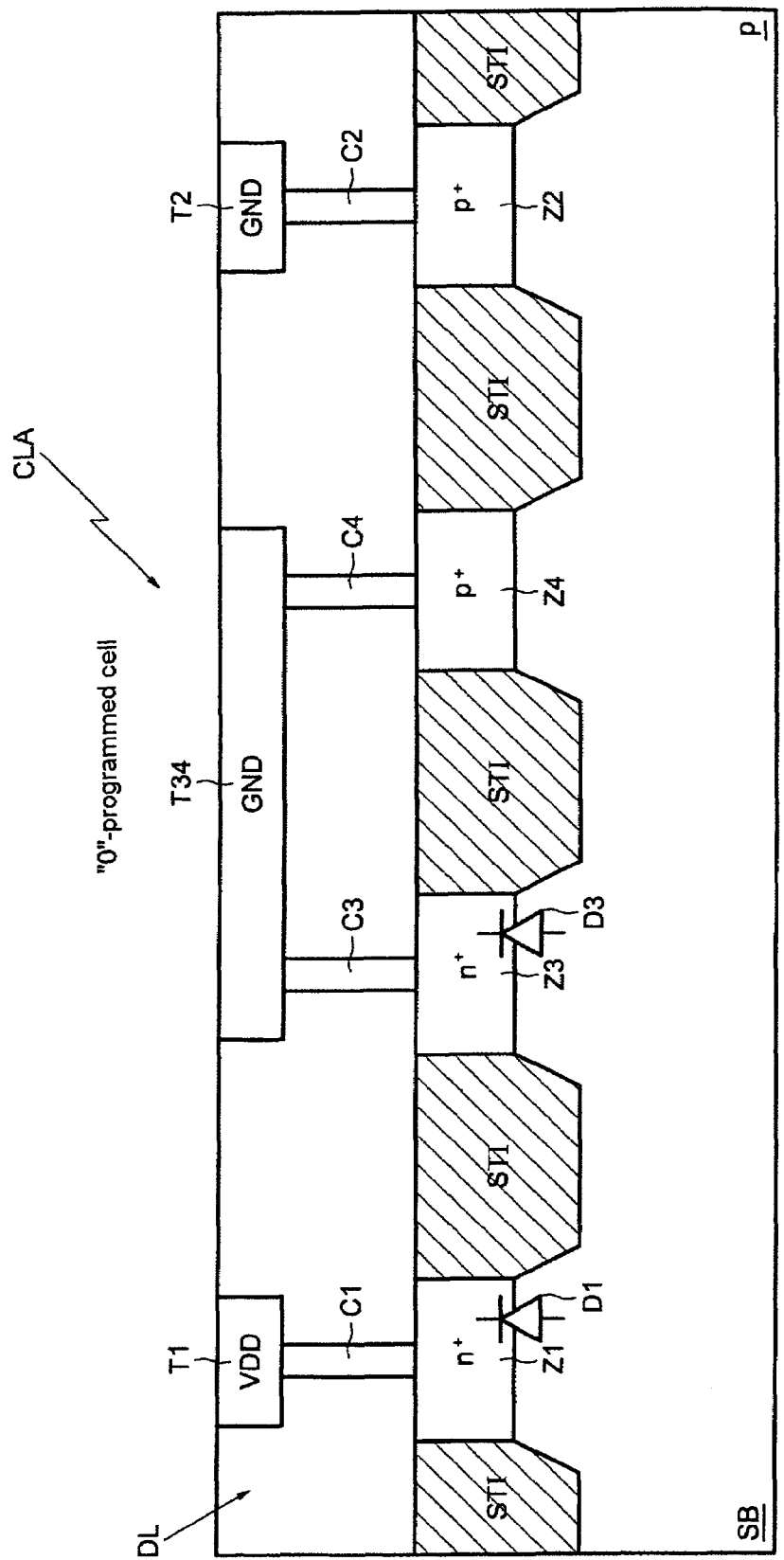
FIGS. 1, 2 and 3 are cross-sectional or top views schematically illustrating a first embodiment of a memory device according to the invention.
Figure 2:
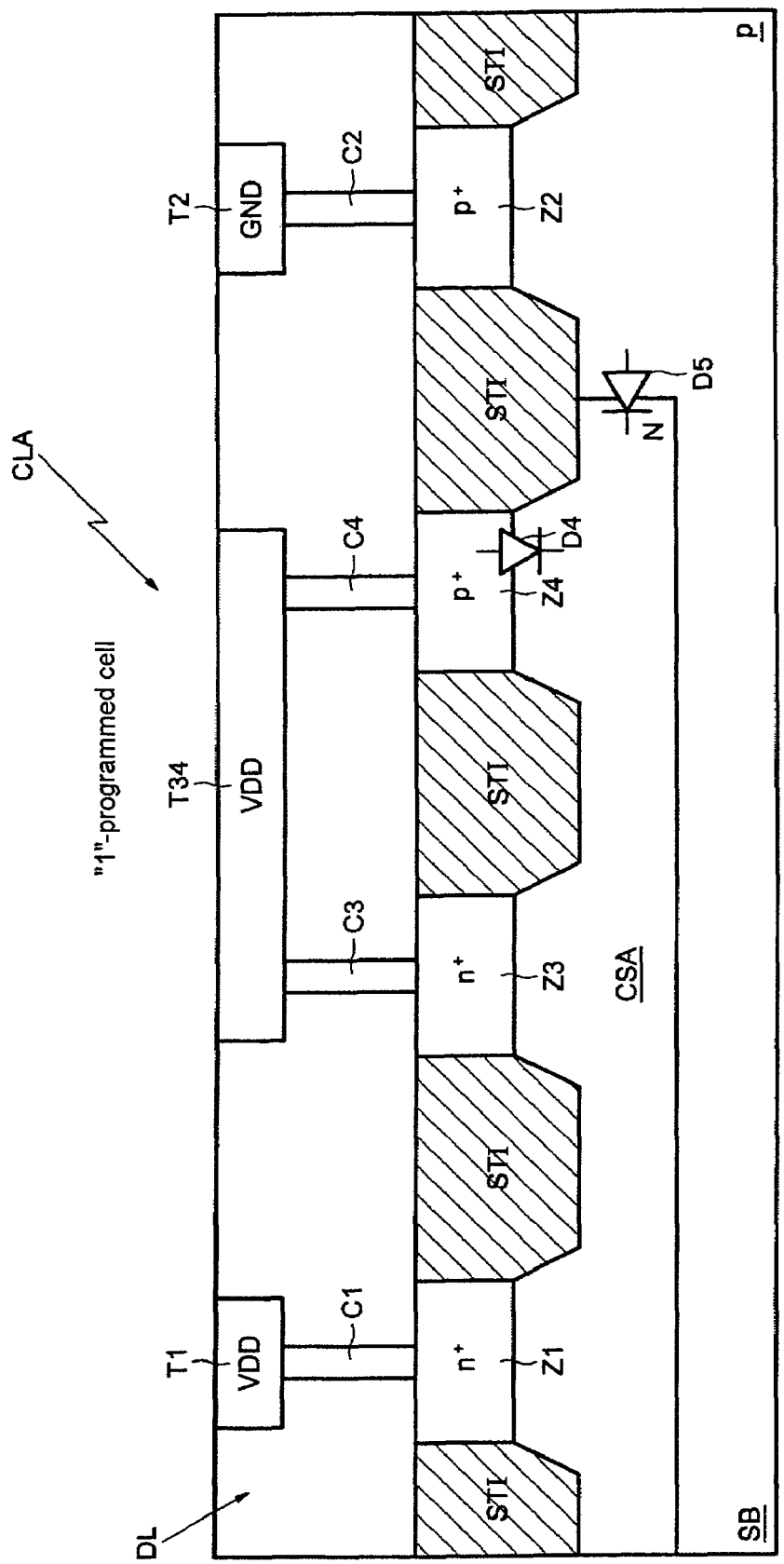

In FIGS. 1 and 2, the reference CLA denotes a semiconductor cell designed to store a binary data item (or bit) capable of taking one of two logic values, for example "0" and "1". The semiconductor cell CLA comprises, in the example described, within a substrate SB of p-type conductivity, four active zones Z1-Z4 that are mutually laterally isolated by isolation zones STI, for example isolation zones of the "shallow trench" type. The p-substrate may be the substrate of the semiconductor wafer itself or else, for example, a p-well in a triple-well technology well known to those skilled in the art.

In the example described in FIGS. 1 and 2, the first active zone Z1 is an $n^+$-doped zone. The second active zone Z2 is a $p^+$-doped zone. The third active zone Z3 is an $n^+$-doped zone and the fourth active zone Z4 is a $p^+$-doped zone. Each of the active zones Z1-Z4 is conventionally connected, in a manner known per se, to a contact C1-C4, for example made of tungsten. These contacts connect the active zones to the metallization level M1 of the integrated circuit. More precisely, the contact C1 connects the active zone Z1 to metal track T1, whereas the contact C2 connects the second active zone Z2 to a track T2. The contacts C3 and C4 connect the third and fourth active zones Z3 and Z4 to a track T34 that forms an electrically conducting connection.

Figure 4:
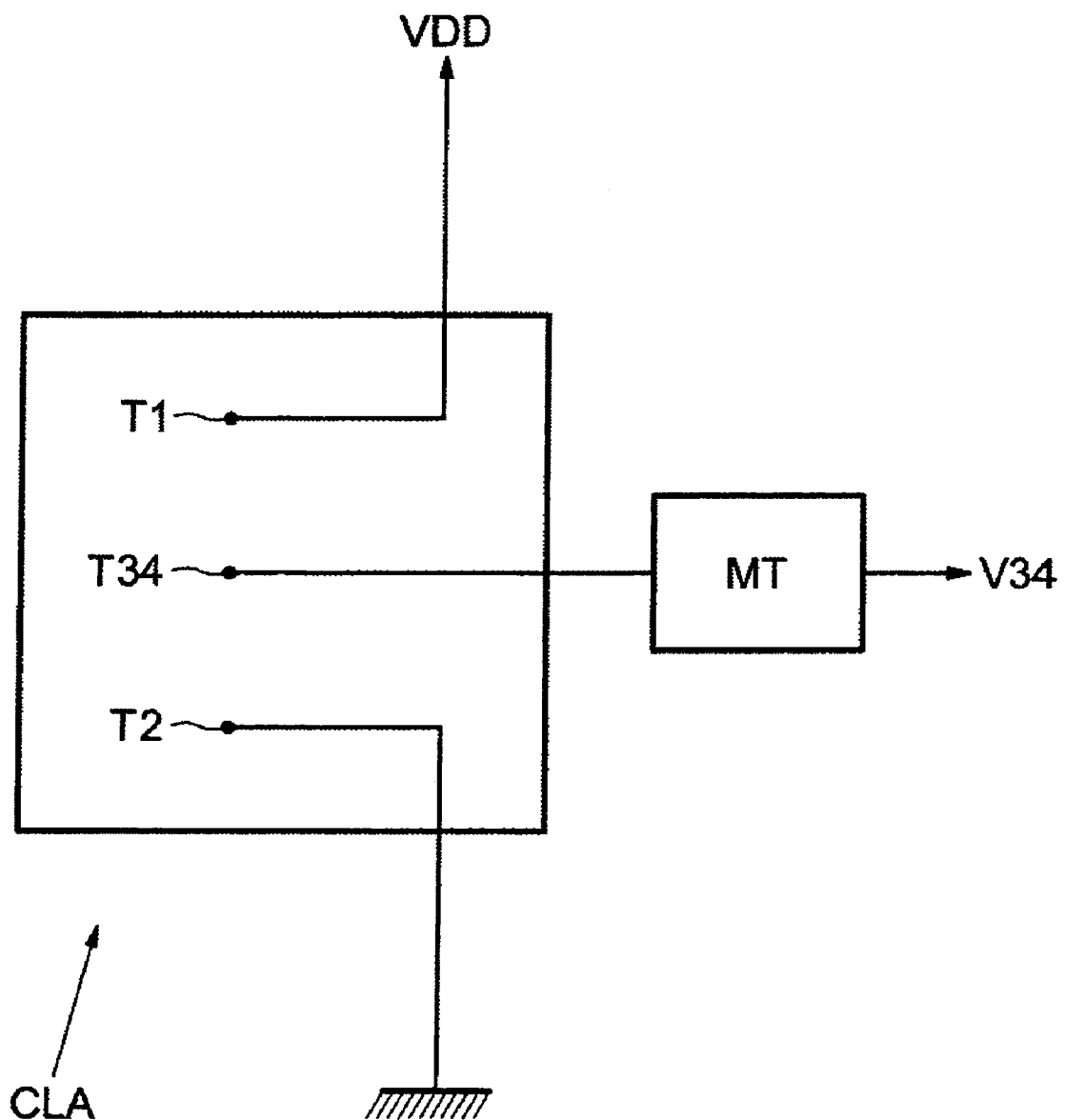
FIG. 4 is a schematic diagram illustrating an example of a means or circuit for reading a cell of a memory device according to the invention.

One or possibly several different dielectric materials, denoted in common by the reference DL, electrically isolate the contacts and the various tracks of the metallization level M1. The various tracks T1, T34 and T2 are conventionally connected in a manner known per se to contacts located on the outside of the integrated circuit by vias and/or other metal tracks lying at upper levels of the integrated circuit. Thus, as illustrated very schematically in FIG. 4, it is possible to apply a first voltage, for example the supply voltage VDD that may vary between 5 volts and 1 volt, to the track T1 and consequently to the first active zone Z1, and to apply a second voltage, for example the ground potential, to the track T2 and consequently to the second active zone Z2.

Moreover, as will be seen in detail later, the logic value of the bit that will be stored in the cell CLA may be determined by measuring the voltage V34 present on the metal track T34. This read operation may be performed by any measurement means MT known per se. This voltage may be equal to the supply voltage VDD, indicating a "1" logic value, or equal to the ground potential indicating a "0" logic value.

The difference between the structural arrangement of FIG. 1 and that of FIG. 2 lies in the fact that in FIG. 2, a well CSA is provided in the substrate region SB, and the well has interfaces with the first active zone Z1, the third active zone Z3 and the fourth active zone Z4. This well has an opposite type of conductivity to that of the substrate region. It is consequently, in this example, of n type and commonly called an "n-well". As will now be seen, the presence or otherwise of this well CSA will determine the logic value "0" or "1", of the bit stored in the cell CLA. More precisely, if it is desired to program the cell CLA with a first logic value, for example a logic "0", the well CSA will not be implanted (FIG. 1).

Consequently, the pn junction between the first active zone Z1 and the substrate region SB forms a diode D1, the cathode of which faces the zone Z1 and the anode of which faces the substrate SB. The same applies as regards the diode D3 resulting from the pn junction formed between the third active zone Z3 and the p-substrate region. Thus, if when reading this cell CLA, the voltage VDD is applied to the first active zone Z1 and the ground potential is applied to the second active zone Z2, the fourth active zone Z4 is then electrically connected to ground GND via the substrate region SB.

Moreover, since the substrate SB is ground-biased via the active zone Z2, the first active zone Z1 is biased by VDD and the diode D1 is non-conducting, the fourth active zone Z4 is consequently electrically isolated from the supply voltage VDD. As regards the diode D3, both its terminals are grounded. It is consequently also non-conducting. In conclusion, the track T34 is at ground potential GND, which is representative in the example described here of programming a logic zero.

Thus, in the example shown in FIG. 1, the cell includes semiconductor electrical connection means, internal to the substrate, which are designed so as to electrically connect the fourth active zone Z4 to the second active zone Z2. Here, these semiconductor electrical connection means comprise the substrate region SB. Moreover, the cell includes semiconductor electrical isolation means, internal to the substrate, which are designed so as to electrically isolate the active zone Z3 and the active zone Z4 from the first active zone Z1. Here, these semiconductor electrical isolation means comprise essentially the non-conducting diode D1 formed by the $n^+/p$ junction between the zone Z1 and the p-substrate region.

When it is desired to program the cell CLA with a second logic value, for example a logic "1", the well CSA is then implanted (FIG. 2). In this case, when the voltage VDD is applied to the first active zone Z1 and ground potential to the second active zone Z2, the metallization T34 is then taken to the potential VDD via the first active zone Z1, the well CSA and the third active zone Z3. Moreover, the pn junction formed between the substrate region SB and the well CSA forms a non-conducting (reverse-biased) diode D5 and consequently electrically isolates the well CSA from the second active zone Z2 and therefore from ground GND.

The diode D4, formed by the pn junction between the fourth active zone Z4 and the well CSA, has both its terminals at the voltage VDD. It is consequently non-conducting. Thus, the presence of the well CSA is representative of the programming of a logic "1", which, when the cell CLA is read, will apply the supply voltage VDD to the track T34. In this programming, the semiconductor electrical connection means, internal to the substrate, are designed so as to electrically connect the third active zone Z3 to the first active zone Z1. Here, these semiconductor electrical connection means comprise the well CSA.

Figure 3:
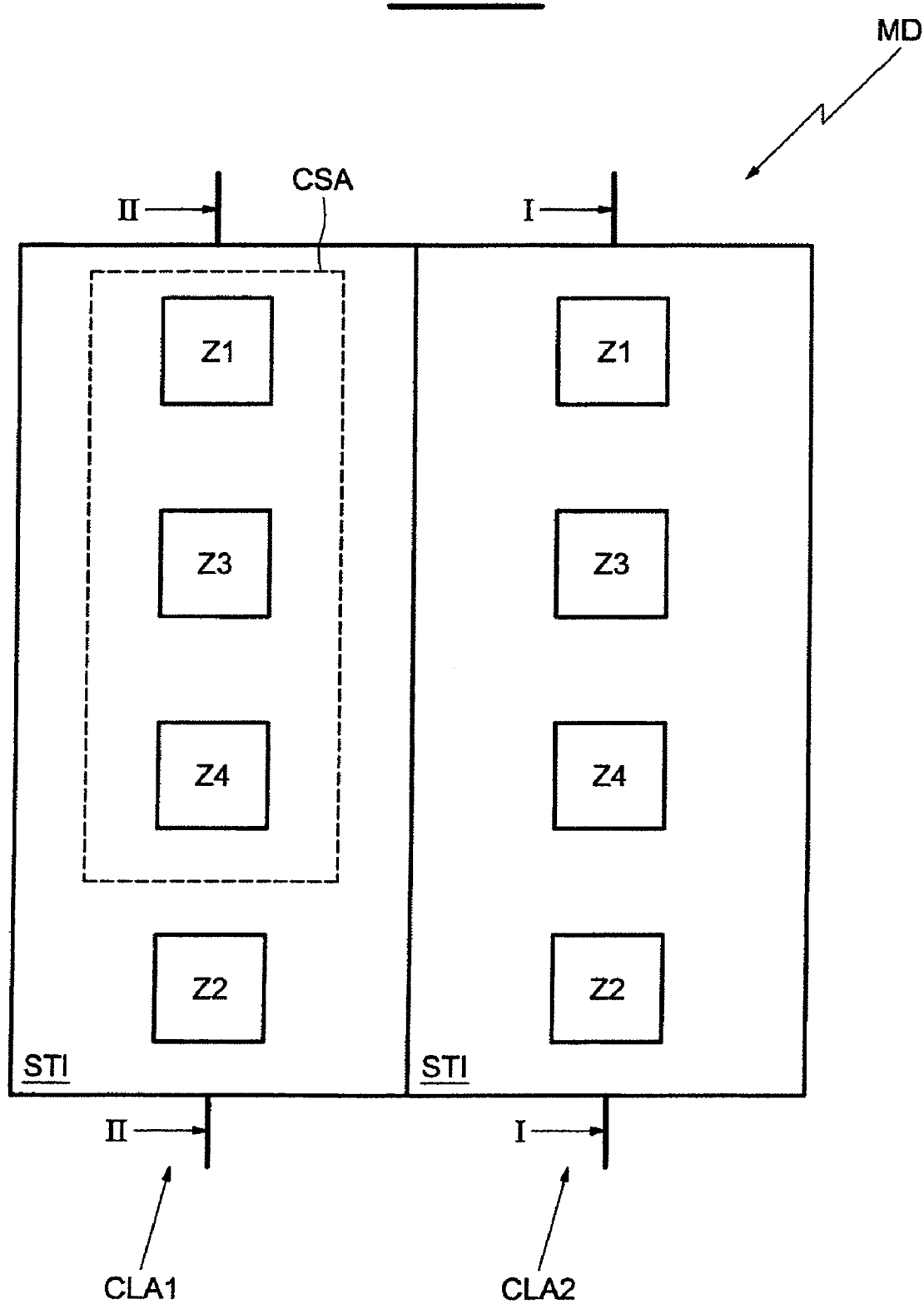

Moreover, the semiconductor isolation means are designed so as to electrically isolate the third and fourth active zones Z3 and Z4 from the second active zone Z2. Here, these electrical isolation means essentially comprise the diode D5 resulting from the pn junction formed between the substrate region SB and the well CSA. In fact, FIGS. 1 and 2 are partial cross sections along the lines I-I and II-II of FIG. 3. This FIG. 3 shows a memory device MD according to the invention, comprising a set of semiconductor cells, here two semiconductor cells for the purpose of simplification. The memory device MD comprises, in the left-hand part of FIG. 3, a cell CLA1 having the well CSA, whereas the cell CLA2 (in the right-hand part of FIG. 3) includes no well CSA. Consequently, the memory device MD of FIG. 3 stores the two binary data items "1", "0". It should be noted in FIG. 3 that, for the sake of simplification, the metal contacts and tracks C1-C4 and T1, T2, T34 have not been shown.

Figure 5:
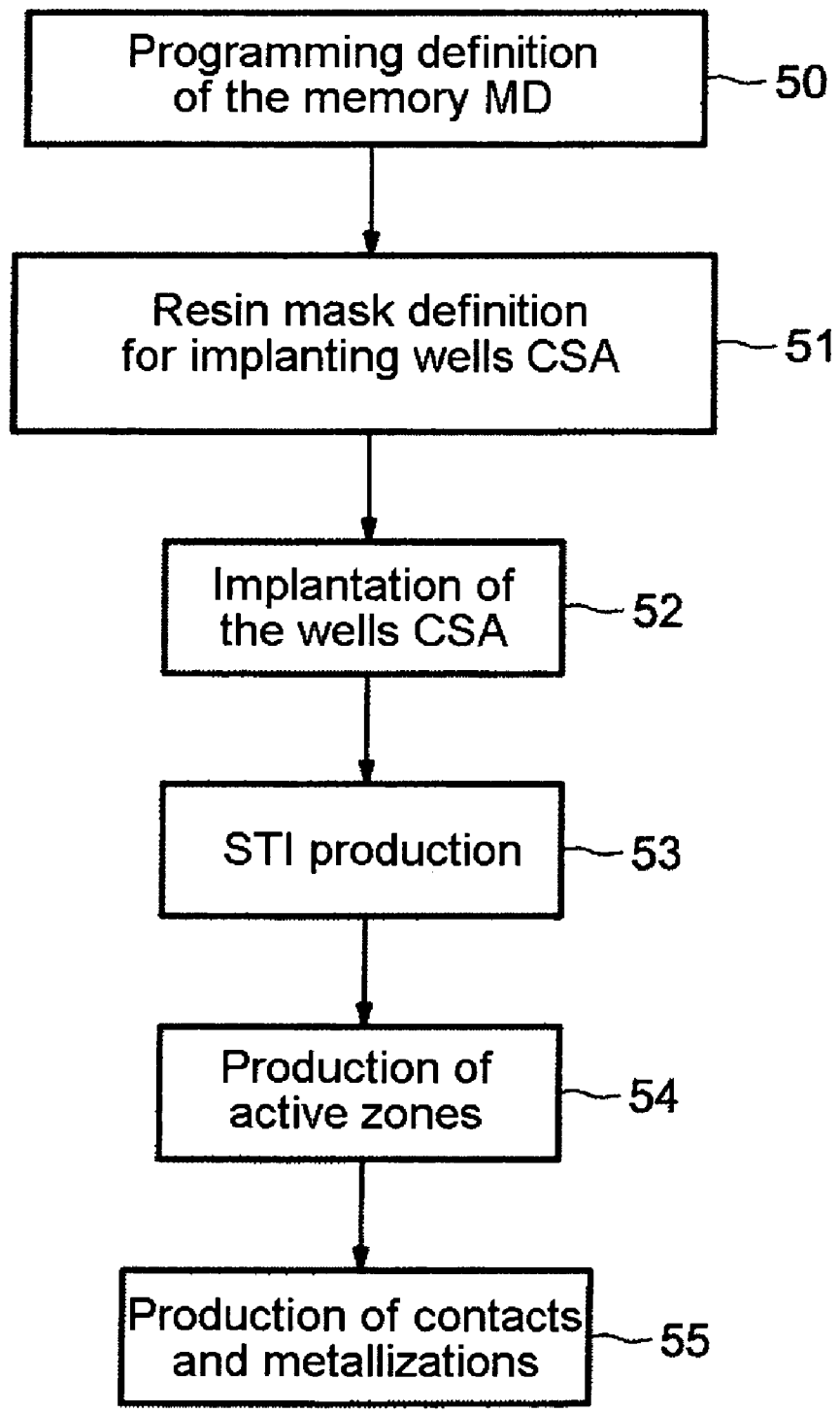
FIG. 5 is a flowchart illustrating the main steps in a programming method according to the invention compatible with the embodiment illustrated in FIGS. 1 to 3.

One method of programming a memory device MD incorporating the set of semiconductor cells of the type of those illustrated in FIGS. 1 and 2 will now be described with reference more particularly to FIG. 5. The programming of the memory MD is firstly defined in a step 50. In other words, the logic values 0 and 1 of the various bits intended to be programmed into the various cells of the memory are defined. Next, a resist layer is deposited on the substrate region SB. Apertures corresponding to the locations of the optional wells CSA are then made in this resist, in a conventional manner known per se. The resist layer, perforated by these apertures, therefore defines the implantation mask for the wells CSA (step 51).

Several options are possible for producing this implantation mask. A first option includes defining the locations of the apertures in the resist mask using a photolithography technique. More precisely, those parts of the resist corresponding to the future apertures are irradiated via a photolithography mask, and then the resist thus irradiated is etched so as to form the apertures. This option means that the programming is "frozen in", in the sense that it is necessary to develop one specific mask per memory programming operation.

Another option includes irradiating the resist layer at appropriate places using a conventional technique known per se, namely electron beam irradiation. This option makes the programming completely flexible, as the points of impingement of the electron beam on the resist are modified as required, that is to say depending on the desired effective programming for the memory. It is also possible to combine these two options. In other words, the implantation mask for the wells may be defined using, for part of the memory, a photolithography technique, and an electron beam irradiation technique used for the other part of the memory.

Once the implantation mask for the wells has been produced, the n-type implantation operation is carried out through this mask so as to simultaneously produce all the wells CSA of the memory MD (step 52). Next, the lateral isolation zones STI are produced conventionally in a manner known per se (step 53). The active zones Z1-Z4 are also produced in a conventional manner (step 54) by implantation. Finally, the contacts and the metallizations of the integrated circuit are produced (step 55), again in a conventional manner known per se.

Another embodiment of the invention will now be described with reference more particularly to FIGS. 6 to 9. In this embodiment, a logic "0" or a logic "1" is programmed not by implanting or not implanting a well in the substrate region SB but by the choice of conductivity ($n^+$ or $p^+$) of the third and fourth active zones Z3 and Z4. More precisely, in this embodiment, whatever the programmed logic value in the cell CLB, the latter includes an n-type well CSB placed in the substrate region SB and having an interface with the first active zone Z1 and the third active zone Z3.

Figure 6:
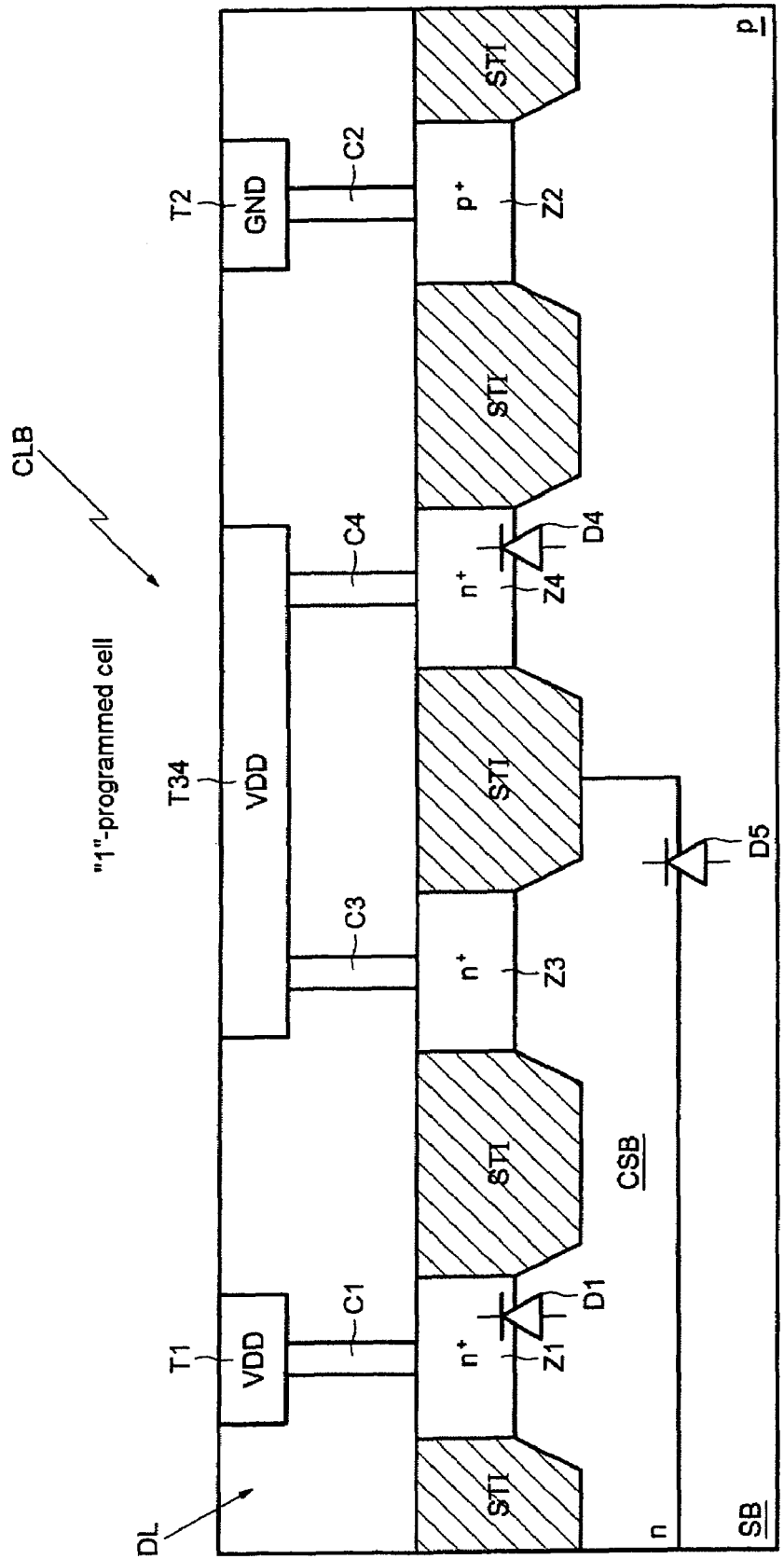
FIGS. 6, 7 and 8 are cross-sectional or top views schematically illustrating another embodiment of a memory device according to the invention.

As illustrated in FIG. 6, when it is desired to program a logic "1" in the cell CLB, the third and fourth active zones Z3 and Z4 are then $n^+$-doped zones (therefore having an n-type conductivity). When, for reading, the voltage VDD is applied to the active zone Z1 and the ground potential GND applied to the second active zone Z2, the track T34 is taken to the potential VDD via the first active zone Z1, the well CSB and the third active zone Z3.

Moreover, the first and third active zones Z1 and Z3 are electrically isolated from the second active zone Z2 by the reverse-biased diode D5 formed by the pn junction between the well CSB and the substrate region SB. Likewise, the fourth active zone Z4 is electrically isolated from the second active zone Z2 by the non-conducting diode D4 formed by the pn junction between this fourth active zone Z4 and the substrate region SB.

Thus, in this embodiment, the semiconductor electrical connection means, internal to the substrate, are designed so as to electrically connect the third active zone Z3 to the first active zone Z1 and in this case they comprise the well CSB. Moreover, the semiconductor electrical isolation means, internal to the substrate, are designed so as to electrically isolate the third active zone Z3 and the fourth active zone Z4 from the second active zone Z2. Here, they comprise the non-conducting diode D5 formed between the well CSB and the substrate SB and the diode D4 formed between the fourth active zone Z4 and the substrate SB.

Figure 7:
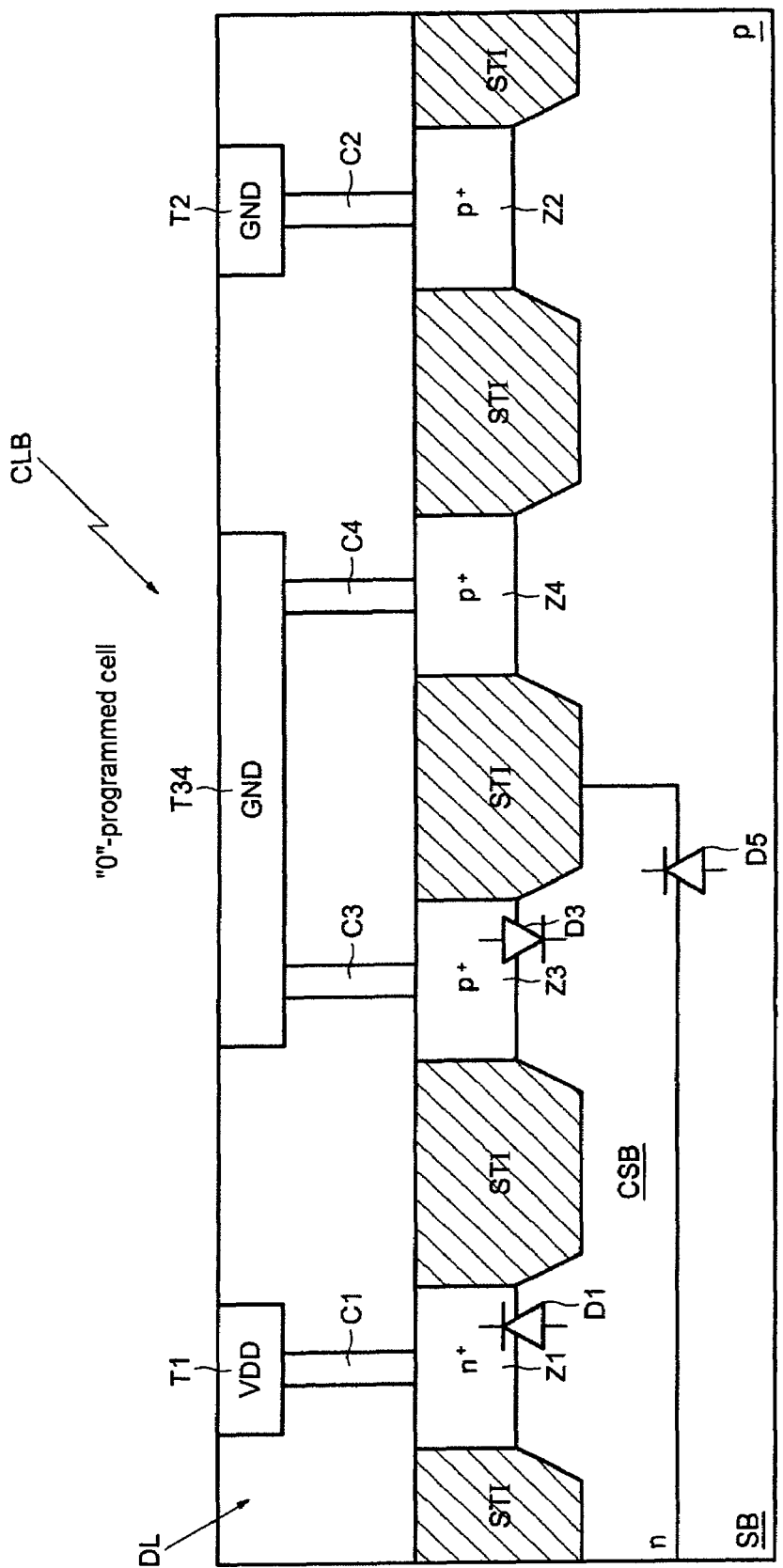

When it is desired to program a logic "0", the third and fourth active zones Z3 and Z4 are this time $p^+$-doped active zones (FIG. 7). Consequently, when, for reading, the voltage VDD is applied to the first active zone Z1 and ground potential applied to the second active zone Z2, the metallization T34 is taken to ground potential via the second active zone Z2, the substrate region SB and the fourth active zone Z4.

Moreover, the third active zone Z3 is electrically isolated from the first zone Z1 by the non-conducting diode D3 formed by the $p^+$/n junction between the third active zone and the well CSB. Likewise, the fourth active zone Z4 and the second active zone Z2 are electrically isolated from the first active zone Z1 by the diode D5 formed between the well CSB and the substrate region SB.

Thus, in this case the semiconductor electrical connection means, internal to the substrate, are designed so as to electrically connect the fourth active zone Z4 to the second active zone Z2, and they comprise the substrate region SB. Moreover, the electrical isolation means, internal to the substrate, are in this case designed so as to electrically isolate the third and fourth active zones from the first active zone Z1. Here, the means comprise the diodes D3 and D5.

Figure 8:
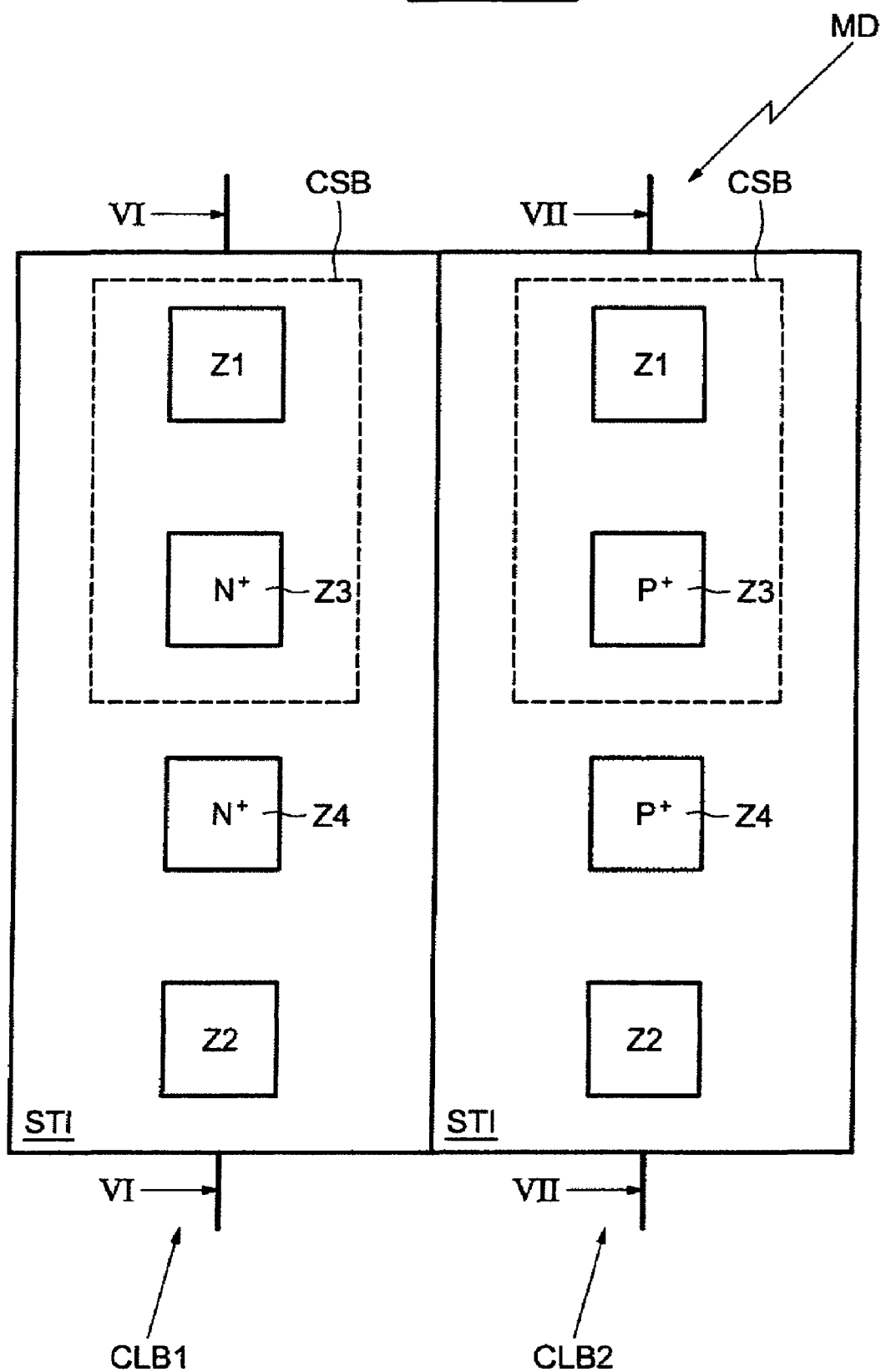

FIGS. 6 and 7 are in fact partial cross sections along the lines VI-VI and VII-VII of FIG. 8 in which, as in FIG. 3, the various contacts and metallizations of the cells have not been shown. In this FIG. 8, the reference CLB1 denotes a cell programmed with a logic "1", while the reference CLB2 denotes a cell programmed with a logic "0".

Figure 9:
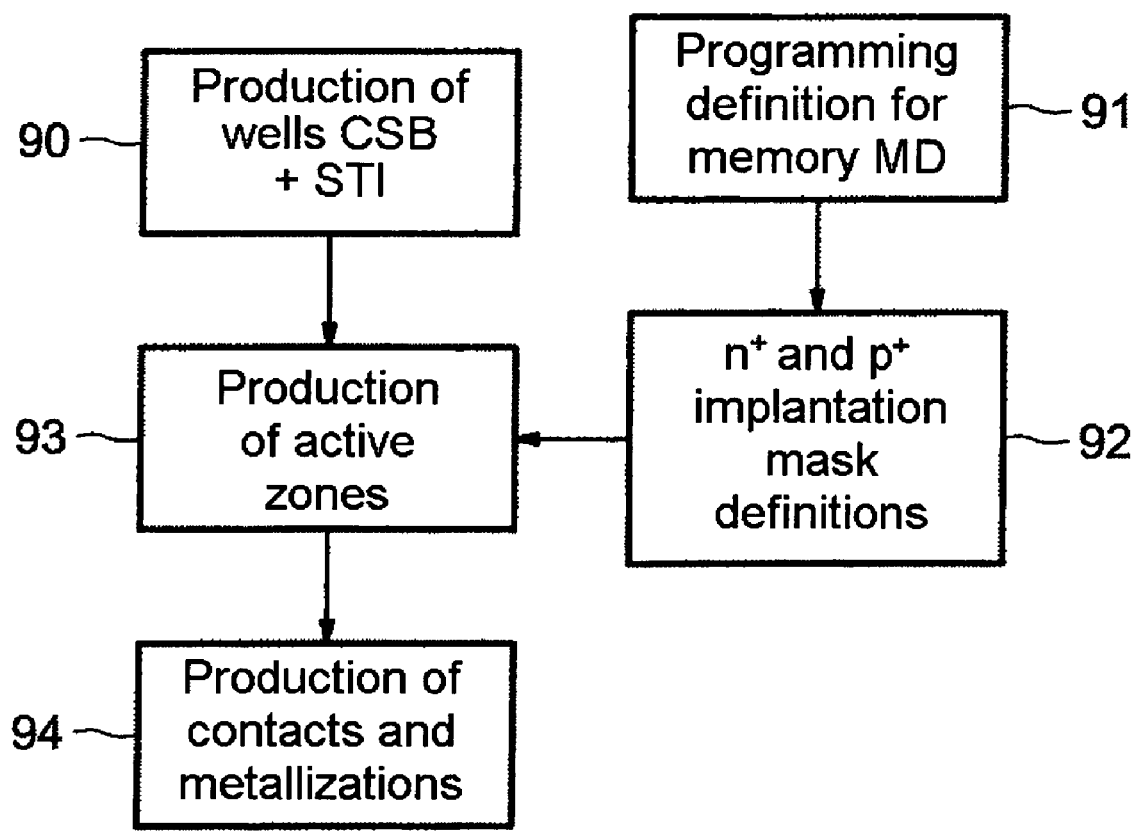
FIG. 9 is a flowchart illustrating another method of programming according to the invention, compatible with the embodiment illustrated in FIGS. 6 to 8.

The main steps in one method of programming a memory device such as that illustrated in FIG. 8 will now be described more particularly with reference to FIG. 9. Various wells CSB and the isolation zones STI are firstly produced (step 90) in a conventional manner known per se. Moreover, after the programming of the memory MD has been defined, two $n^+$ and $p^+$, implantation masks are defined (step 92). Here again, the definition of these $n^+$ and $p^+$ implantation masks may be carried out by a photolithography method and/or by an electron beam irradiation technique, as explained above.

Once these two implantation masks have been defined, the active zones are produced. Specifically, the $n^+$ active zones are produced first, and then the $p^+$ active zones, or vice versa (step 93). Finally, the contacts and metallizations are conventionally produced in a manner known per se (step 94).

The two embodiments of the memory that have just been described both have a high density. More precisely, the two embodiments have a density of 3.5 microns$^2$ per bit in 0.13 micron CMOS technology. They also both offer the possibility of providing a memory having a virgin state (corresponding for example to the logic 0 state). This allows the programming to be optionally modified in a flexible manner as required by the user, by varying the implantations of wells or of active zones. Finally, the embodiments shown in FIGS. 1, 2 and 3 have a low cost as they require only a single masking level for the programming. The embodiment shown in FIGS. 6, 7 and 8 has a higher cost, although still reduced, as it requires two masking levels ($n^+$ and $p^+$).

That which is claimed is:

1. A memory device comprising:
   at least one cell storing a binary data item and including a semiconductor substrate region and first, second, third and fourth active zones that are mutually laterally isolated within the substrate;
   the first active zone to be connected to a first voltage, the second active zone, of an opposite type of conductivity to that of the first active zone, to be connected to a second voltage;
   an electrically conductive connection adjacent the substrate and connecting together the third and fourth active zones;
   a semiconductor electrical connection within the substrate to electrically connect at least one of the third and fourth active zones to at least one of the first active zone and the second active zone, depending on the logic value of the binary data item; and
   a semiconductor electrical isolation within the substrate to electrically isolate the third and fourth active zones from at least one of the second active zone and the first active zone, respectively.

2. The memory device according to claim 1, wherein the semiconductor electrical isolation comprises pn junctions defining non-conducting diodes between at least one active zone and the substrate region.

3. The memory device according to claim 1, further comprising a semiconductor well located in the substrate and having an opposite type of conductivity to that of the substrate, and having an interface with at least one active zone; wherein the semiconductor electrical isolation comprises at least one pn junction defining a non-conducting diode between at least one of the at least one active zone and the semiconductor well and between the well and the substrate; and wherein the semiconductor electrical connection is defined by at least one of the substrate and the well.

4. The memory device according to claim 3, wherein the third and fourth active zones have respectively opposite types of conductivity; and wherein the well includes interfaces with the third and fourth active zones and with that of the first or second active zones having the same type of conductivity as that of the well depending on the logic value of the binary data item.

5. The memory device according to claim 3 wherein the semiconductor electrical isolation comprises pn junctions formed between the substrate and the active zones having an opposite type of conductivity to that of the substrate, or between the substrate and the semiconductor well having interfaces with the third and fourth active zones and with that of the first or second active zones having the same type of conductivity as that of the well.

6. The memory device according to claim 5 wherein the first active zone has n-type conductivity and the second active zone has p-type conductivity, and the well has n-type conductivity.

7. The memory device according to claim 3, wherein the third and fourth active zones have the same type of conductivity, the well has an interface with the third active zone and with that of the first or second active zones having the same type of conductivity as that of the well, and the type of conductivity of the third and fourth active zones is based upon the logic value of the binary data item.

8. The memory device according to claim 1, further comprising a semiconductor well located in the substrate and having an opposite type of conductivity to that of the substrate, and having an interface with at least one active zone; wherein the third and fourth active zones have the same type of conductivity, the well has an interface with the third active zone and with that of the first or second active zones having the same type of conductivity as that of the well, and the semiconductor electrical isolation comprises a pn junction forming a non-conducting diode between the well and the substrate and a pn junction forming a non-conducting diode between the third active zone and the well or between the fourth active zone and the substrate region based upon the logic value of the binary data item; and wherein the semiconductor electrical connection is defined by at least one of the substrate and the well.

9. The memory device according to claim 8, wherein that the first active zone has n-type conductivity and the second active zone has p-type conductivity, and the well has an n-type conductivity and the type of conductivity of the third and fourth active zones is based upon the logic value of the binary data item.

10. The memory device according to claim 1, wherein the first voltage is a supply voltage and the second voltage is ground.

11. The memory device according to claim 1, wherein the at least one cell comprises a plurality of cells storing a set of binary data items.

12. The memory device according to claim 1, a reading circuit for reading each cell and comprising a first voltage source connected to the first active zone, a second voltage source connected to the second active zone, and a measurement unit for measuring the voltage present at the electrically conductive connection.

13. A method for reading the logic value of a binary data item contained in a cell of a memory device, the cell including
a semiconductor substrate region and first, second, third and fourth active zones that are mutually laterally isolated within the substrate,
the first active zone to be connected to a first voltage, the second active zone, of an opposite type of conductivity to that of the first active zone, to be connected to a second voltage,
an electrically conductive connection adjacent the substrate and connecting together the third and fourth active zones,
a semiconductor electrical connection within the substrate to electrically connect at least one of the third and fourth active zones to at least one of the first active zone and the second active zone, depending on the logic value of the binary data item, and
a semiconductor electrical isolation within the substrate to electrically isolate the third and fourth active zones from at least one of the second active zone and the first active zone, respectively;
the method comprising:
applying the first voltage to the first active zone;
applying the second voltage to the second active zone; and
measuring the voltage at the electrically conductive connection.

14. A method of programming a binary data item in at least one cell comprising, within a semiconductor substrate, four active zones that are mutually laterally isolated, the first active zone to be connected to a first voltage, the second active zone, of an opposite type of conductivity to that of the first active zone, to be connected to a second voltage, the third and fourth active zones being connected together via an electrically conductive connection adjacent the substrate, the method comprising defining the value of the binary data item by an implantation in at least one of a part of the substrate and in the third and fourth active zones.

15. The method according to claim 14, wherein the third and fourth active zones have opposite types of conductivity and the logic value of the binary data is defined based upon implantation, in the substrate region, of a semiconductor well having an opposite type of conductivity to that of the substrate region, and having interfaces with the third and fourth active zones and with that of the first or second active zones having the same type of conductivity as that of the well.

16. The method according to claim 15, wherein the first active zone has the n-type conductivity and the second active zone has the p-type conductivity, and the well has n-type conductivity.

17. The method according to claim 14, wherein the third and fourth active zones both have the same type of conductivity; further comprising implanting a semiconductor well in the substrate and having an opposite type of conductivity to that of the substrate, and having an interface with the third active zone and with that of the first or second active zones having the same type of conductivity as that of the well; and wherein the logic value of the binary data item is defined based upon the type of implantation for the third and fourth active zones.

18. The method according to claim 17, wherein the first active zone has the n-type conductivity and the second active zone has the p-type conductivity, and the well has an n-type conductivity and the type of conductivity of the third and fourth active zones is of the n-type or p-type depending on the logic value of the binary data item.

19. The method according to claim 15 wherein the at least one cell comprises a plurality of cells which are programmed with values of a set of binary data items.

20. The method according to claim 19 wherein implantation of the wells comprises:
using an implantation mask having apertures defining locations of the wells; and
simultaneously implanting the wells through the apertures in the implantation mask.

21. The method according to claim 20 wherein an implantation mask of $n^+$ type and an implantation mask of $p^+$ type are defined; and wherein the active zones of cells are simultaneously implanted through the apertures in the implantation masks using the implantation masks in succession.

22. The method according. to claim 21, wherein the locations of the apertures in the implantation masks are defined by at least one of photolithography and an electron beam.

* * * * *